(12) United States Patent
Kim et al.

(10) Patent No.: US 7,764,483 B2
(45) Date of Patent: Jul. 27, 2010

(54) SEMICONDUCTOR ETCHING APPARATUS

(75) Inventors: Jin-Man Kim, Gyeonggi-do (KR);
Yun-Sik Yang, Gyeonggi-do (KR);
Young-Min Min, Gyeonggi-do (KR);
Sang-Ho Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 725 days.

(21) Appl. No.: 11/709,400

(22) Filed: Feb. 22, 2007

(65) Prior Publication Data
US 2008/0066867 A1 Mar. 20, 2008

(30) Foreign Application Priority Data
Sep. 20, 2006 (KR) .................. 10-2006-0090928

(51) Int. Cl.
*H02N 13/00* (2006.01)
(52) U.S. Cl. ..................... 361/234
(58) Field of Classification Search ............... 361/234
See application file for complete search history.

(56) References Cited
U.S. PATENT DOCUMENTS

| | | | |
|---|---|---|---|
| 6,039,836 A | 3/2000 | Dhindsa et al. | |
| 6,117,349 A | 9/2000 | Huang et al. | |
| 6,178,919 B1 | 1/2001 | Li et al. | |
| 6,306,244 B1 | 10/2001 | Kennedy et al. | |
| 6,344,105 B1 | 2/2002 | Daugherty et al. | |
| 2002/0144786 A1* | 10/2002 | Chiang et al. | 156/345.51 |
| 2005/0042881 A1* | 2/2005 | Nishimoto et al. | 438/710 |
| 2005/0051100 A1* | 3/2005 | Chiang et al. | 118/728 |
| 2005/0122505 A1* | 6/2005 | Miyajima | 355/72 |
| 2008/0194113 A1* | 8/2008 | Kim et al. | 438/710 |

* cited by examiner

*Primary Examiner*—Ronald W Leja
(74) *Attorney, Agent, or Firm*—Myers Bigel Sibley & Sajovec, P.A.

(57) ABSTRACT

There is provided a semiconductor etching apparatus which removes particles remaining on the upper surface of an electro static chuck (ESC) during an etching process, thereby preventing a chucking force from decreasing and minimizing a leak of helium. To prevent a failure of the etching process due to a wafer chucking failure, by preventing polymers from falling down on the upper part of the ESC when a wafer is dechucked or transferred, the semiconductor etching apparatus comprises: an ESC selectively holding a wafer to be entered and positioned inside a chamber, and including a lower electrode part to which RF power is applied; parts positioned at a stepped portion of the ESC and respectively surrounding a side of the ESC; and a gas flow blocking part blocking a gas flow in a vacuum path formed between the ESC and the parts.

3 Claims, 3 Drawing Sheets

SEMICONDUCTOR ETCHING APPARATUS

CROSS-REFERENCE TO RELATED APPLICATION

This application claims the benefit of Korean Patent Application No. 10-2006-0090928, filed Sep. 20, 2006, the disclosure of which is hereby incorporated herein by reference in its entirety.

FIELD OF THE INVENTION

The present invention relates to a semiconductor etching apparatus, and more particularly, to a semiconductor etching apparatus structured to remove particles remaining on the upper surface of an electro static chuck (ESC) while an etching process is performed, thereby preventing a chucking force from decreasing and minimizing leakage of helium.

BACKGROUND OF THE INVENTION

Generally, a semiconductor device is fabricated by repeatedly performing various fabrication processes on a silicon wafer. Semiconductor fabrication processes include oxidation, masking, photoresist coating, etching, diffusion and layer formation processes with respect to a wafer which is a material of a semiconductor device. Before and after the aforementioned processes, other processes such as cleaning, dry and testing processes are additionally performed. Specifically, an etching process is one of the important processes of forming a pattern on a wafer. A photolithography process is performed by an etching process and a photoresist coating process. After a wafer is coated with photoresist of photosensitivity and a pattern is transmitted to the wafer, etching is performed along the pattern, thereby providing a device with predetermined physical properties according to the pattern.

An etching process is largely divided into wet etching and dry etching. Wet etching is performed by a method of soaking a wafer in a wet etching container including a chemical substance to effectively remove the uppermost layer of the wafer, a method of spraying the chemical substance on the surface of the wafer, or a method of flowing a chemical material onto the wafer tilted at a predetermined angle.

Examples of dry etching include plasma etching using a gaseous etching gas, ion beam etching, reactive ion etching, and the like. A reactive ion etching process is performed by supplying an etching gas into a reaction chamber, ionizing the gas, and accelerating the ionized gas on the surface of a wafer, so as to physically and chemically remove the uppermost layer of the surface of the wafer. Reactive ion etching is widely used because etching may be easily controlled, productivity may be high, and formation of a pattern with a size of about 1 µm may be possible.

The parameters for uniform etching in the reactive ion etching process include the thickness and density of a layer to be etched, the energy and temperature of an etching gas, the adhesiveness of photoresist, the condition of the surface of a wafer, and the uniformity of the etching gas. Specifically, the control of radio frequency (RF), which is a driving force to ionize an etching gas and accelerate the ionized gas on the surface of a wafer to be etched, is an important parameter. The control of RF is further considered as a parameter to be directly and easily controlled while an etching process is actually performed.

For a semiconductor device requiring the design rule of 0.15 µm or less, a dry etching method is generally applied by using a plasma reaction gas.

A plasma-enhanced chemical vapor deposition (PECVD) apparatus and a dry etching apparatus commonly use a plasma gas and have a similar interior constitution. Each processing apparatus includes a chamber for processing a semiconductor substrate, an electrode, to which RF power is applied, for generating plasma of a reaction gas to be supplied to the chamber, and a chuck for supporting the semiconductor substrate.

As examples of the aforementioned processing apparatuses, U.S. Pat. No. 5,510,297 (issued to Telford, et al.) and U.S. Pat. No. 5,565,382 (issued to Tseng, et al.) disclose an apparatus for forming a layer on a semiconductor substrate supported on a susceptor, by using a plasmatized reaction gas; and U.S. Pat. No. 5,259,922 (issued to Yamano, et al.) and U.S. Pat. No. 6,239,036 (issued to Arita, et al.) disclose an apparatus for etching a layer on a semiconductor substrate, by using a plasmatized reaction gas formed by RF power.

In the aforementioned semiconductor etching apparatus, an edge ring is positioned around an edge of the upper surface of the chuck which is positioned to support the semiconductor substrate in the chamber. The edge ring concentrates a plasmatized reaction gas formed in the chamber to the semiconductor substrate. The edge ring is positioned to surround an edge of the semiconductor substrate supported by the chuck and allows the plasmatized reaction gas to be uniformly supplied to the semiconductor substrate.

The aforementioned semiconductor etching apparatus performs an etching process, by allowing an etching gas to flow in a high vacuum condition, and to form plasma. When a layer formed on a wafer is etched, a great amount of heat is inevitably generated, so that a temperature of the wafer increases. The temperature rise may seriously affect the etching uniformity, thereby obstructing the process. During the etching process, for cooling, a coolant flows through an electro static chuck (ESC) positioned at a lower position, thereby continuously maintaining a wafer at a uniform temperature. Further, for smooth exchange of heat between the wafer and ESC in a high vacuum, helium (He) is allowed to flow under the backside of the wafer. Then, to prevent the wafer from deviating by the pressure of helium, high power is applied to the ESC so that a coulomb force is generated and the wafer is chucked. Then, when an etching gas enters the chamber, the RF power is applied to form plasma in the chamber. The plasma includes electrons, radicals and ions. The ions with high reactivity are drawn to the wafer by bias power applied to the ESC and react with a layer material formed on the wafer, so that an etching process is performed. During the etching process, polymers are inevitably generated as byproducts of the reaction. Most polymers are discharged to the outside by a turbo pump positioned at a lower position in the chamber but some remain on parts in the chamber.

FIG. 1 is a view illustrating a structure of a prior art ESC assembly module.

A chamber is provided with an ESC 10 for selectively holding a wafer being entered and positioned. The ESC 10 includes a lower electrode part to which RF power is applied and allows an ESC assembly to be moved up and down. An edge ring 12 is positioned at a stepped portion formed on the ESC 10 and induces discharge of polymers and the like being generated during a process. A lower quartz ring 14 is positioned under the edge ring 12 and is extended to protrude out of an outer side of a stepped portion of the ESC 18. An upper quartz ring 16 is positioned on the lower quartz ring 14 and surrounds the edge ring 12. An insulation ring 18 is positioned to support the lower quartz ring 14 and surrounds the edge of the ESC 10 to protect a sidewall of the ESC 10 upon a plasma reaction.

The prior art ESC assembly module comprises a combination of many parts generally including the edge ring 12, the lower quartz ring 14, the upper quartz ring 16 and the insulation ring 18 at the side of the ESC 10. The parts and the ESC 10 are assembled at connection tolerance. That is, these parts are not coupled with the ESC 10 but are simply placed on a protruding portion at a lower end of the edge of ESC 10, so as to be in contact with the ESC 10 and are made of aluminum and anodizing materials. The ESC 10 and the edge ring 12 are assembled to have slight gaps at assembly tolerance. Although the lower part of the edge ring 12 is in contact with the ESC 10, fine gaps exist therebetween, due to their respective roughness upon metal to metal contact. A vacuum path is formed along the gaps. Before passing the upper quartz ring 16, some polymers generated during the process move to the lower position, along the vacuum path formed at the side of the ESC 10. Since the side of the ESC 10 is continuously cooler than the edge ring 12 being exposed to the plasma and having high temperature, the polymers are likely to remain at the sidewall of the ESC 10, as illustrated in FIG. 2. The polymers accumulated at the sidewall of the ESC 10 are unstable. Accordingly, the polymers remaining at the sidewall of the ESC 10 move up to the upper surface of the ESC 10 by a vortex caused when a wafer is dechucked or transferred after the process. When the polymers remain on the upper surface of the ESC 10, the wafer cannot be secured against the ESC 10 upon the wafer chucking, thereby causing helium to leak at the backside of the wafer, to cause an error. When an error is caused, the wafer is not cooled and the temperature suddenly rises. Then, the impedance of the chamber is changed and the plasma is not stabilized, thereby causing a failure in the etching process.

SUMMARY OF THE INVENTION

Therefore, the present invention is directed to provide a semiconductor etching apparatus which prevents polymers from remaining on the upper part of an electro static chuck (ESC) when a wafer is dechucked or transferred, thereby preventing a failure of an etching process due to a wafer chucking failure.

Embodiments of the present invention provide a semiconductor etching apparatus which prevents polymers from sticking to an electro static chuck (ESC), thereby preventing a failure of an etching process by minimizing a helium leak error due to a wafer chucking failure.

According to an embodiment of the present invention, a semiconductor etching apparatus comprises a chamber; an ESC selectively holding a wafer being entered and positioned inside the chamber and including a lower electrode part to which RF power is applied; parts positioned at stepped portions of the ESC to respectively surround a side of the ESC; and a gas flow blocking part blocking a gas flow in a vacuum path formed between the ESC and the parts.

The parts may include an edge ring that induces discharge of polymers and the like generated during a process, and a quartz ring positioned under the edge ring, so as to be extended to protrude out of an outer side of a stepped portion of the ESC and to surround the edge ring.

The quartz ring may be formed in a single body.

The gas flow blocking part may be formed of an O-ring.

The O-ring may be positioned in the vacuum path formed between the stepped portion of the ESC and a lower end of the quartz ring.

In accordance with another embodiment of the present invention, a semiconductor etching apparatus comprises a chamber; an ESC selectively holding a wafer being entered and positioned inside the chamber and including a lower electrode part to which RF power is applied; an edge ring positioned at a stepped portion formed on the ESC and inducing discharge of polymers and the like being generated during a process; a quartz ring positioned under the edge ring, so as to be extended to protrude out of an outer side of a stepped portion of the ESC and to surround the edge ring, and an O-ring blocking a gas flow in a vacuum path formed between the stepped portion of the ESC and a lower end of the quartz ring. The quartz ring may be formed in a single body and block the gas flow in the vacuum path.

BRIEF DESCRIPTION OF THE DRAWINGS

The above and other features and advantages of the present invention will become more apparent to those of ordinary skill in the art by describing in detail embodiment(s) thereof with reference to the attached drawings in which.

DETAILED DESCRIPTION OF EMBODIMENTS OF THE INVENTION

Figure 1:
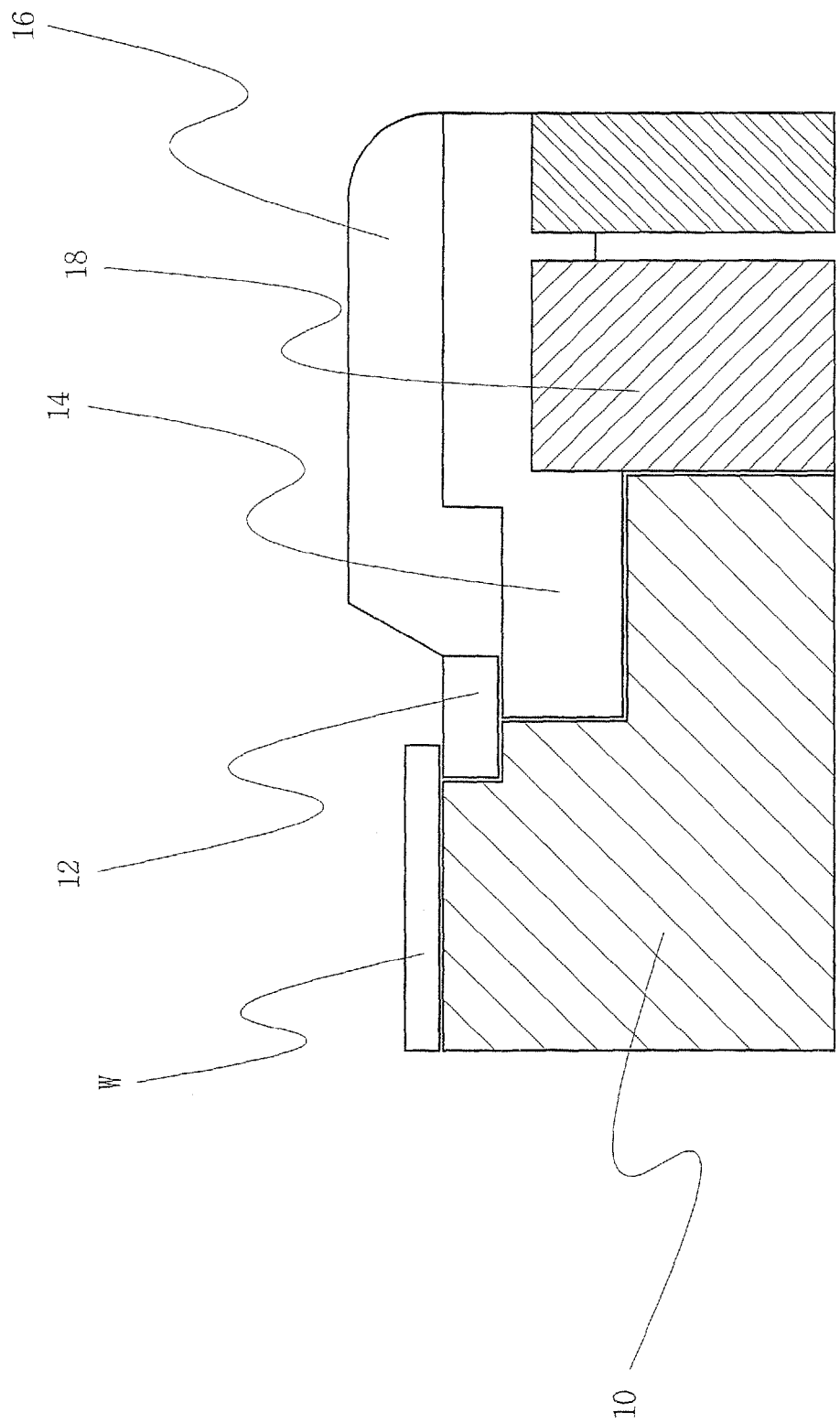
FIG. 1 is a view illustrating a structure of a prior art electro static chuck (ESC) assembly module.
Figure 2:
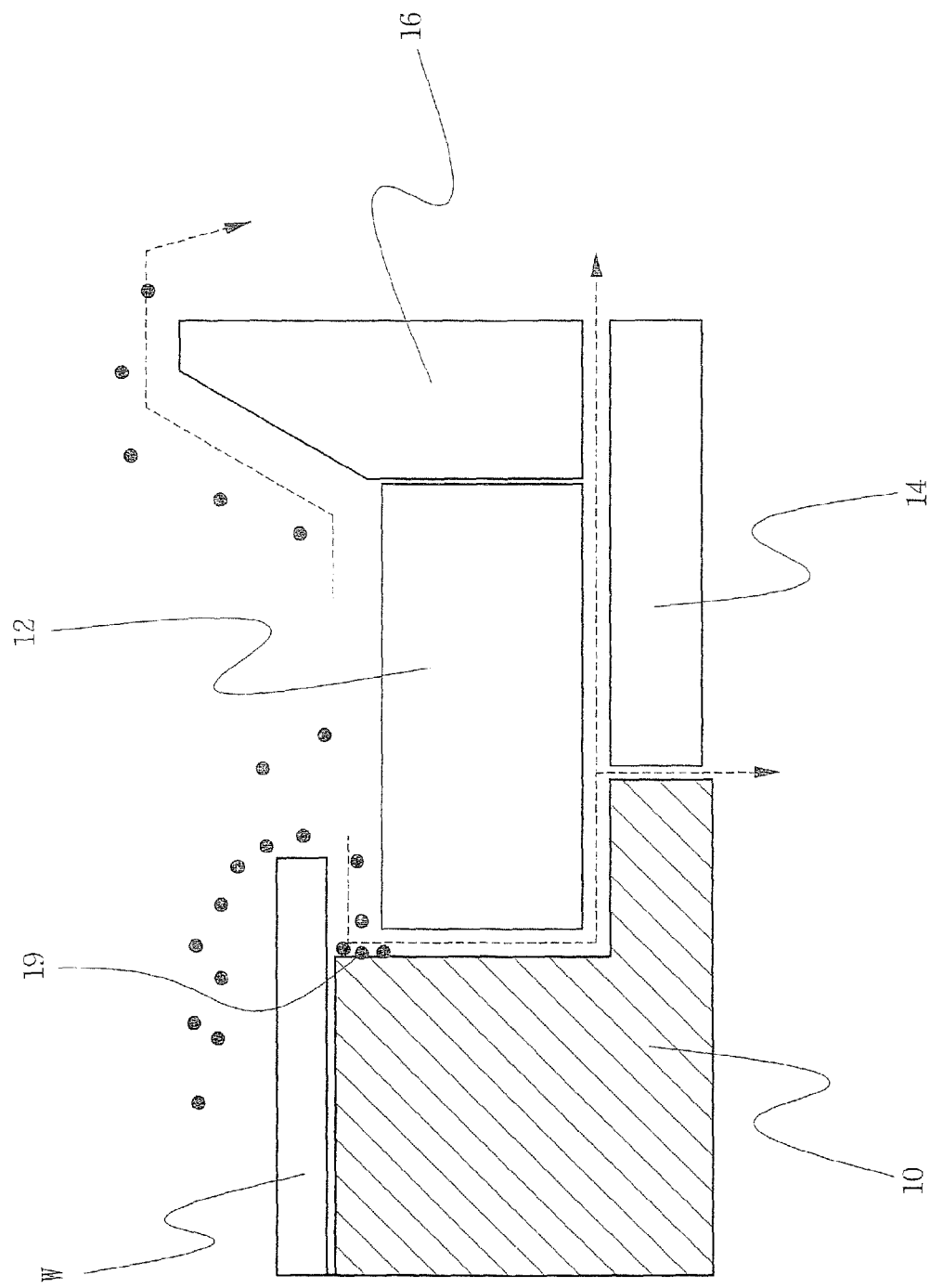
FIG. 2 is a view illustrating polymers being adsorbed in the ESC assembly module of FIG. 2.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly. Moreover, the term "beneath" indicates a relationship of one layer or region to another layer or region relative to the substrate, as illustrated in the figures.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to plan and cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 3:
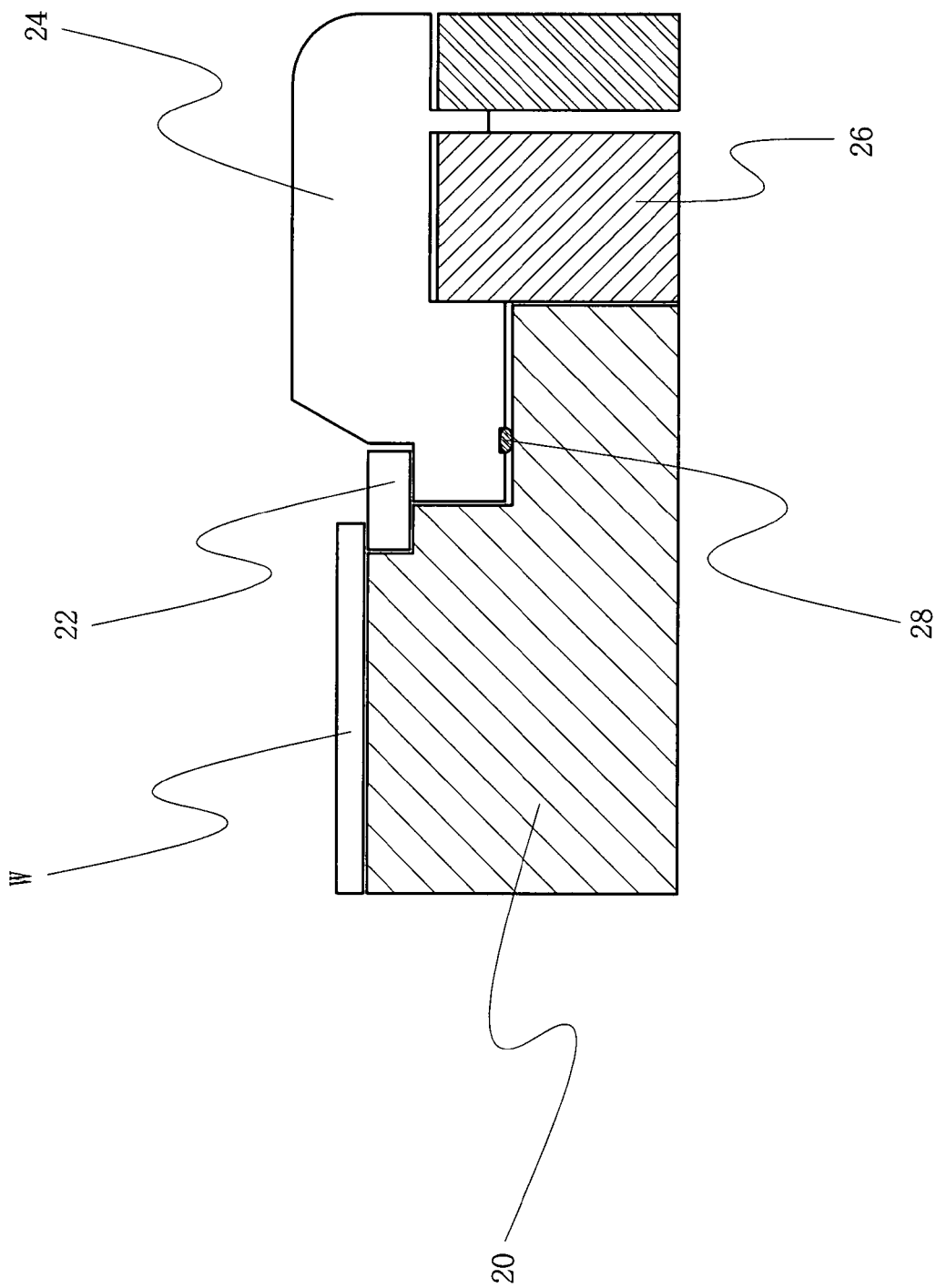
FIG. 3 is a sectional view illustrating a structure of a semiconductor etching apparatus according to an embodiment of the present invention.

FIG. 3 is a sectional view illustrating a structure of a semiconductor etching apparatus according to an embodiment of the present invention.

In the semiconductor etching apparatus, a chamber is provided with an electro static chuck (ESC) 20; an edge ring 22, a quartz ring 24, an insulation ring 26, and an O-ring 28. The ESC 20 selectively holds a wafer being positioned inside the chamber and includes a lower electrode part to which RF power is applied. The edge ring 22 is positioned at a stepped portion of the ESC 20 and induces discharge of polymers and the like being generated during a process. The quartz ring 24 is positioned under the edge ring 22 and is extended to protrude out of an outer side of a stepped portion of the ESC 20 and to surround the edge ring 22. The insulation ring 26 is positioned to support the quartz ring 24 and to surround the edge of the ESC 20, and to protect a sidewall of the ESC 20 upon a plasma reaction. The O-ring 28 is positioned in a vacuum path between the stepped portion of the ESC 20 and the lower part of the quartz ring 24, to block a gas flow.

The operation of the semiconductor etching apparatus according to embodiments of the present invention will be described, in detail, with reference to FIG. 3.

The ESC 20, which selectively holds a wafer being entered and positioned inside the chamber and includes a lower electrode part to which RF power is applied, is positioned in the chamber, so that the ESC assembly is movable up and down. The ESC 20 and the parts positioned at the edge of the ESC 20 are positioned in contact with each other.

The parts include the edge ring 22 for inducing discharge of polymers and the like being generated during a process, the quartz ring 24 positioned under the edge ring 22 and extended to protrude out of an outer side of a stepped portion of the ESC 20 to surround the edge ring 22, and an insulation ring 26 positioned to support the quartz ring 24 and to surround the edge of the ESC 20, in order to protect a sidewall of the ESC 20 upon a plasma reaction.

The edge ring 22 is positioned at a stepped portion of the ESC 20 and induces the discharge of polymers and the like being generated during the process. The quartz ring 24 is positioned under the edge ring 22 and extended to protrude out of the outer side of the stepped portion of the ESC 20 and to surround the edge ring 22. The insulation ring 26 is positioned to support the quartz ring 24 and to surround the edge of the ESC 20, in order to protect the sidewall of the ESC 20 upon the plasma reaction.

As illustrated in FIG. 1, the prior art ESC assembly module comprises a combination of many parts normally including the edge ring 12, the lower quartz ring 14, the upper quartz ring 16 and the insulation ring 18 at the side of the ESC 10. The parts and the ESC 10 are assembled at connection tolerance. That is, these parts are not coupled with the ESC 10 but are simply placed on a protruding portion at a lower end of the edge of ESC 10, to be in contact with the ESC 10 made of aluminum and anodizing materials. The ESC 10 and the edge ring 12 are assembled to have slight gaps at assembly tolerance. Although the lower end of the edge ring 12 contacts with the ESC 10, fine gaps exist therebetween, due to their respective roughness upon the metal to metal contact. A vacuum path is formed along the gaps. Before passing the upper quartz ring 16, some polymers generated during the process move to the lower position, along the vacuum path formed at the side of the ESC 10.

However, unlike the prior art ESC assembly module in which the lower and upper quartz rings 14 and 16 are separated from each other, the ESC assembly module of the present invention comprises the quartz ring 24 in which the lower quartz ring and the upper quartz ring are formed in a single body. Accordingly, the present invention blocks gas flow in the gap between the lower quartz ring 14 and the upper quartz ring 16 of the prior art ESC assembly module.

In the present invention, the O-ring 28 is positioned between the stepped portion of the ESC 20 and the lower end of the quartz ring 24, thereby preventing a vacuum path of a gas from being formed, to block the gas flow. The O-ring 28 is pressed by the weight of the quartz ring 24 formed in the single body, thereby blocking the vacuum path caused by the roughness of the ESC 20 and the quartz ring 24 upon their metal to metal contact.

Helium (He) continuously flows under the backside of a wafer, and helium leaks between the wafer and the edge part of the ESC 20 at a pressure under about 1 sccm (standard cubic centimeter). Accordingly, high pressure is continuously maintained around the gaps of the parts connected to the side of the ESC 20, compared to the pressure inside the chamber. Even though polymers are generated during the process, the polymers are discharged from the side of the ESC 20, through the upper surface of the quartz ring 24, by a turbo pump positioned at a lower position.

Consequently, the polymers adsorbed in the gap at the side of the ESC 20 are prevented from moving up to the upper part of the ESC 20 by a vortex when the wafer is dechucked or transferred, thereby causing no error of helium leak at the backside of the wafer. Furthermore, since the number of times for preventive maintenance (PM) of the equipment due to the error of helium leak is reduced, the operability of the equipment is improved to increase productivity.

In an embodiment of the present invention, the upper quartz ring and the lower quartz ring are formed in the single body and the O-ring 28 is positioned between the ESC and the quartz ring 24 which is in the single body. However, the O-ring may be positioned between the upper quartz ring and the lower quartz ring and between the ESC and the lower quartz ring, thereby blocking the vacuum path between the ESC and the parts in contact with the side of the ESC and preventing polymers from sticking to the vacuum path.

As described above, in the semiconductor etching apparatus according to embodiments of the present invention, gas is prevented from flowing through the gaps between the ESC and the parts in contact with the side of the ESC, so that the polymers and the like being generated during the process are not adsorbed in the side of the ESC. Accordingly, even though a vortex occurs when the wafer is dechucked or transferred after a process, polymers do not move up to the upper part of the ESC. Consequently, a process failure due to the error of helium leak is prevented, and the number of times for preventive maintenance (PM) of the equipment relating to the error of helium leak is reduced, thereby improving the operability of the equipment and increasing productivity.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor etching apparatus comprising:

a chamber;

an electro static chuck that is configured to selectively hold a wafer positioned inside the chamber, wherein the electro static chuck includes a lower electrode part to which RF power is applied;

an edge ring positioned at a stepped portion of the electro static chuck and respectively surrounding a side of the electro static chuck, wherein the edge ring induces discharge of polymers during an etching process;

a single body quartz ring positioned under the edge ring and extending so as to protrude out of an outer side of the stepped portion of the electro static chuck and to surround the edge ring, and such that there is only one vacuum path formed between the electro static chuck and the edge ring; and a gas flow blocking part positioned in the vacuum path formed between the electro static chuck and the edge ring, and configured to block gas flow in the vacuum path.

2. The semiconductor etching apparatus of claim 1, wherein the gas flow blocking part comprises an O-ring.

3. The semiconductor etching apparatus of claim 2, wherein the O-ring is positioned in the vacuum path formed between the stepped portion of the electro static chuck and a lower end of the quartz ring.

* * * * *